(12) United States Patent
Okumura et al.

(10) Patent No.: US 9,252,770 B2
(45) Date of Patent: Feb. 2, 2016

(54) TOUCH SENSOR AND MANUFACTURING METHOD FOR THE SAME, AS WELL AS TRANSFER RIBBON FOR TOUCH SENSOR MANUFACTURING

(71) Applicant: NISSHA PRINTING CO., LTD., Kyoto (JP)

(72) Inventors: Shuzo Okumura, Kyoto (JP); Asako Sakashita, Kyoto (JP); Eiji Nakagawa, Kyoto (JP); Ryohei Nagase, Kyoto (JP); Tomohiro Matsuzaki, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 0 days.

(21) Appl. No.: 14/386,943

(22) PCT Filed: Mar. 27, 2013

(86) PCT No.: PCT/JP2013/058951
§ 371 (c)(1),
(2) Date: Sep. 22, 2014

(87) PCT Pub. No.: WO2013/146859
PCT Pub. Date: Oct. 3, 2013

(65) Prior Publication Data
US 2015/0041302 A1 Feb. 12, 2015

(30) Foreign Application Priority Data
Mar. 28, 2012 (JP) ................................. 2012-075222

(51) Int. Cl.
*H03K 17/975* (2006.01)
*H05K 1/00* (2006.01)
(Continued)

(52) U.S. Cl.
CPC .......... *H03K 17/9622* (2013.01); *B32B 37/025* (2013.01); *B41M 5/40* (2013.01);
(Continued)

(58) Field of Classification Search
CPC ...... H03K 2217/960755; H03K 2217/960765; H03K 2017/9613; H03K 17/9622; B32B 37/025; B32B 2457/208; G02F 1/13338; G06F 3/044
USPC .................... 174/258; 200/600; 345/173, 174
See application file for complete search history.

(56) References Cited

U.S. PATENT DOCUMENTS 8,451,234 B2   5/2013   Sato et al.
8,647,463 B2   2/2014   Yamazaki et al.
(Continued)

FOREIGN PATENT DOCUMENTS

JP   2003-15286    1/2003
JP   2009-15489    1/2009
(Continued)

OTHER PUBLICATIONS

International Search Report issued Jul. 2, 2013 in International Application No. PCT/JP2013/058951.
(Continued)

*Primary Examiner* — Sherman Ng
(74) *Attorney, Agent, or Firm* — Wenderoth, Lind & Ponack, L.L.P.

(57) ABSTRACT

A touch sensor including a plurality of first electrode films and a plurality of second electrode films which are formed on a surface of a substrate and are arranged in different directions from each other; and a manufacturing method for the same. The manufacturing method includes: a first transfer step, which uses a transfer ribbon made by at least an insulating layer and an electrode-imparting layer which are entirely sequentially stacked as a transfer layer upon an elongated release film, attaches to a substrate only a portion of the transfer layer to which heat and pressure have been applied, and by stripping the release film, transfers the transfer layer in at least the shape of a first electrode film; and a second transfer step including attaching only the portion of the transfer layer to which the heat and the pressure had been applied and stripping the release film.

12 Claims, 14 Drawing Sheets

(51) Int. Cl.
  *G06F 3/041* (2006.01)
  *G06F 3/045* (2006.01)
  *H03K 17/96* (2006.01)
  *G06F 3/044* (2006.01)
  *B32B 37/00* (2006.01)
  *B41M 5/40* (2006.01)

(52) U.S. Cl.
  CPC .......... *G06F 3/044* (2013.01); *B32B 2307/202* (2013.01); *B32B 2457/16* (2013.01); *B32B 2457/208* (2013.01); *B41M 2205/30* (2013.01); *G06F 2203/04103* (2013.01); *H03K 2017/9613* (2013.01); *H03K 2217/960755* (2013.01); *H03K 2217/960765* (2013.01)

(56) References Cited

U.S. PATENT DOCUMENTS

| | | | |
|---|---|---|---|
| 8,723,046 B2 | 5/2014 | Hashimoto et al. | |
| 2009/0009486 A1 | 1/2009 | Sato et al. | |
| 2010/0045625 A1* | 2/2010 | Yang | G06F 3/044 345/173 |
| 2010/0295819 A1* | 11/2010 | Ozeki | G06F 3/044 345/174 |
| 2011/0216018 A1* | 9/2011 | Kim | G06F 3/041 345/173 |
| 2012/0094090 A1 | 4/2012 | Yamazaki et al. | |
| 2012/0325639 A1* | 12/2012 | Scuderi | G06F 3/044 200/600 |
| 2013/0000954 A1 | 1/2013 | Hashimoto et al. | |
| 2013/0180841 A1* | 7/2013 | Yilmaz | G06F 3/044 200/600 |

FOREIGN PATENT DOCUMENTS

| | | |
|---|---|---|
| JP | 2009-260536 | 11/2009 |
| JP | 2010-108038 | 5/2010 |
| JP | 2011-13725 | 1/2011 |
| JP | 2011-150550 | 8/2011 |
| JP | 2011-198207 | 10/2011 |
| JP | 2012-8621 | 1/2012 |
| JP | 2012-11637 | 1/2012 |
| WO | 2011/001961 | 1/2011 |

OTHER PUBLICATIONS

Notice of Reasons for Rejection issued Aug. 12, 2014 in corresponding Japanese patent application No. 2014-507947 (with English translation).

* cited by examiner

FIG.12
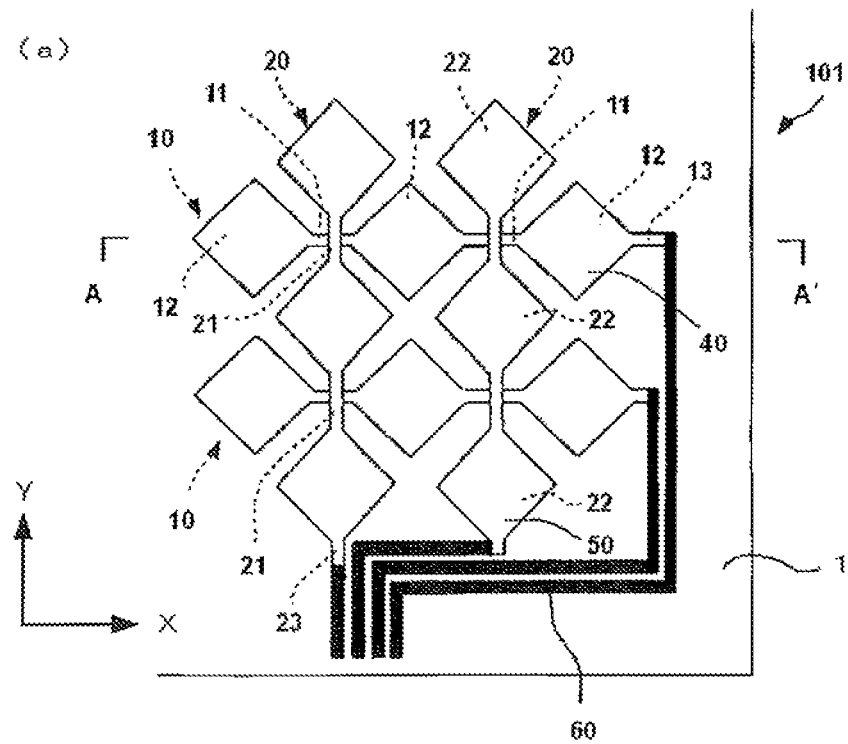
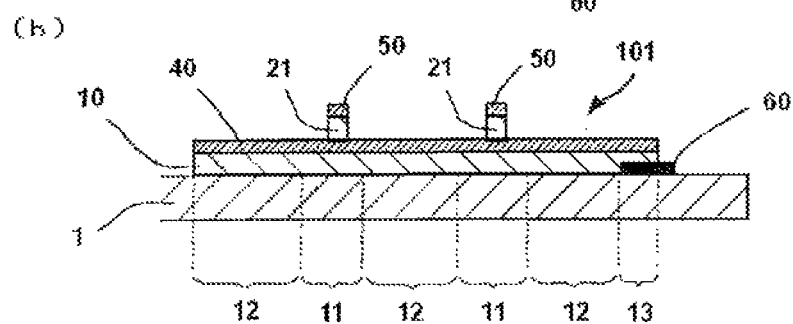
FIG.13
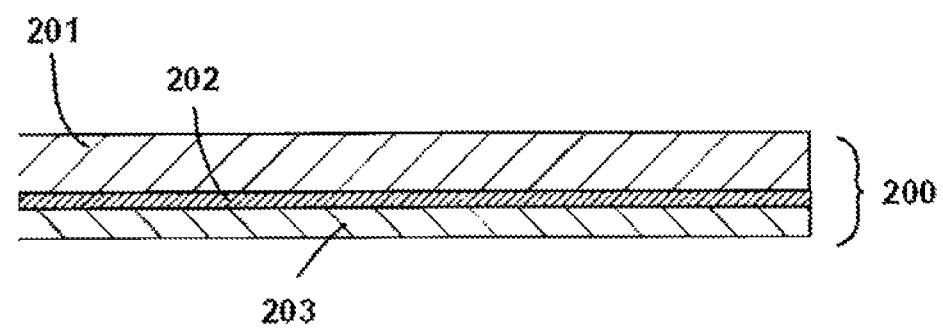

[FIG.16]
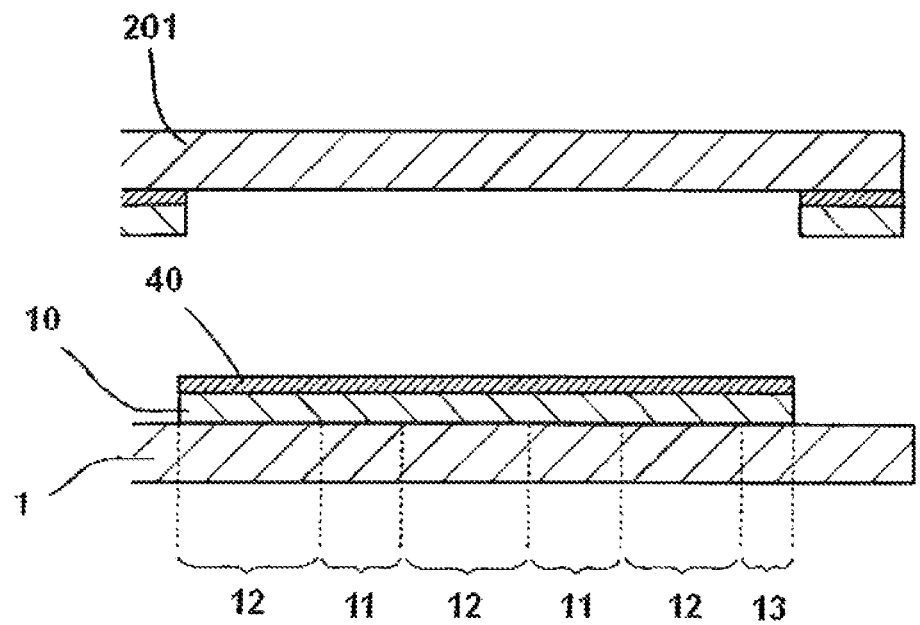
FIG.17
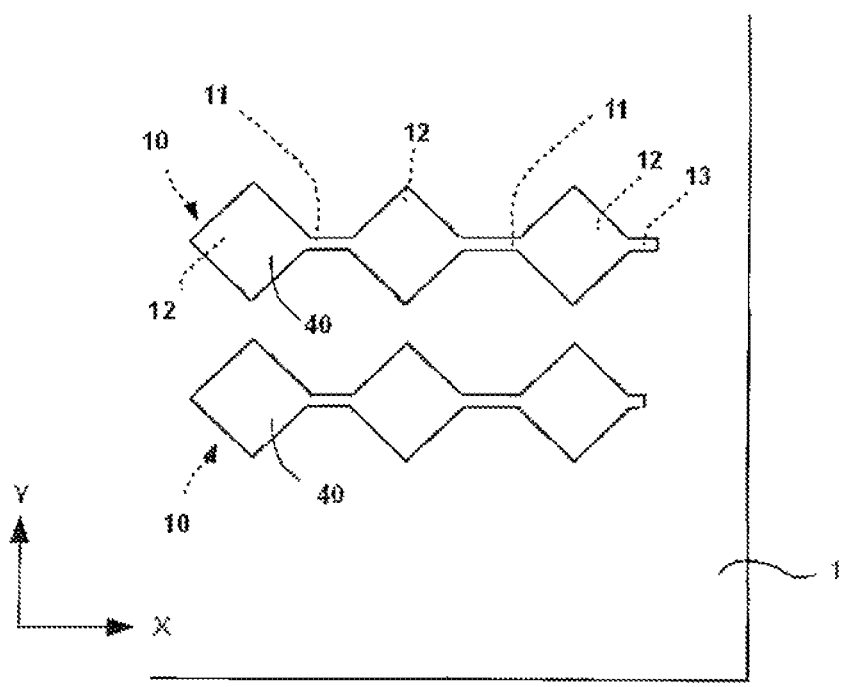

FIG.20
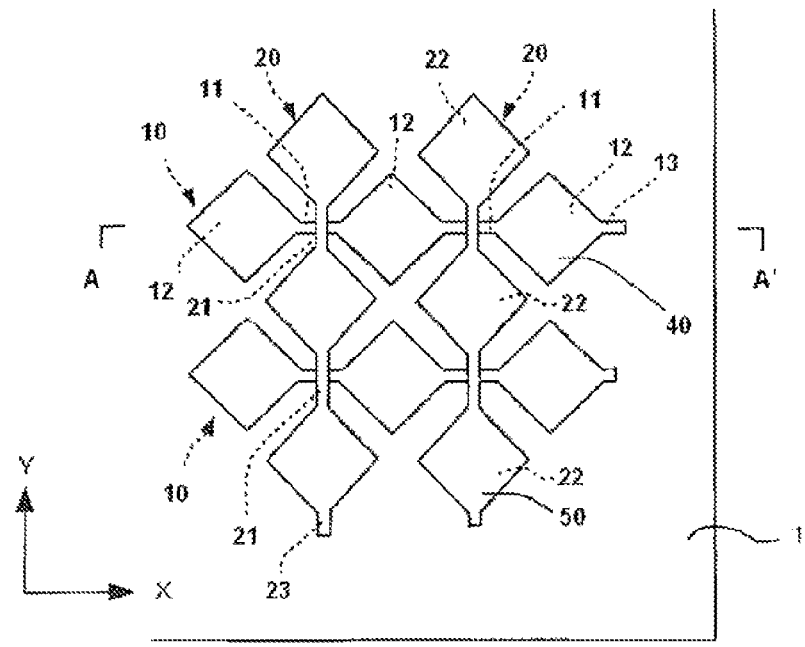
FIG.21
(a)
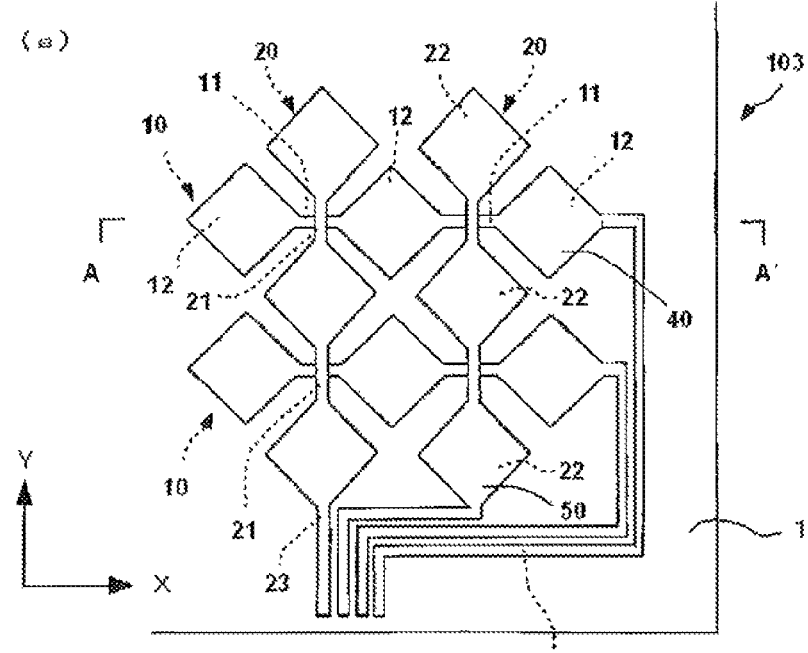
(b)
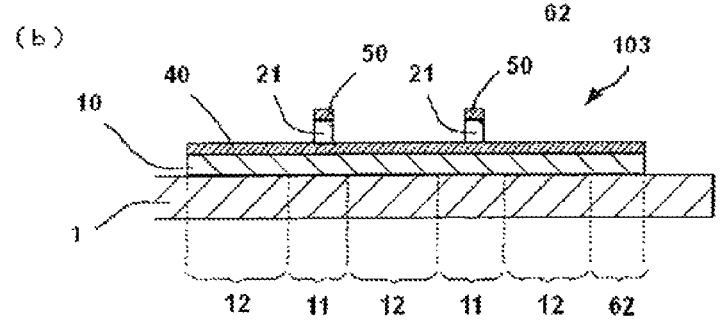

TOUCH SENSOR AND MANUFACTURING METHOD FOR THE SAME, AS WELL AS TRANSFER RIBBON FOR TOUCH SENSOR MANUFACTURING

TECHNICAL FIELD

The present invention relates to a capacitance type touch sensor having a plurality of first electrode films and a plurality of second electrode films which are formed on a surface of a substrate and are arranged in different directions from each other.

BACKGROUND ART

Conventionally, various touch sensors have been devised. For example, a capacitance type touch sensor (hereinafter, "touch sensor") has been known, which includes a plurality of electrode films formed so as to intersect each other via an insulating layer and in which by moving a finger or the like close to a panel in which the electrode films are formed, a capacity is generated between, the electrode films of the panel, and a current that charges the generated capacity is detected, thereby performing position detection (see, e.g., Patent Document 1).

A touch sensor 100 disclosed in Patent Document 1 includes a substrate 1, an input region 2, and routing wires 60. The input region 2 is a region surrounded by an alternate long and two short dashes line in (a) of FIG. 27 and is a region in which position information of a finger that is inputted to the touch sensor is detected, in the input region 2, X electrode films 10 are arranged as a plurality of first electrode films and Y electrode films 20 are arranged as a plurality of second electrode films. A plurality of the X electrode films 10 extend along an X axis direction as a first direction as shown and are spaced apart from each other in a Y axis direction. A plurality of the Y electrode films 20 extend along the Y axis direction as a second direction as shown and are spaced apart from each other in the X axis direction.

Each X electrode film 10 integrally includes a plurality of first island-like electrode portions 12 arranged in the X axis direction and first bridge wiring portions 11 each electrically connecting the adjacent first island-like electrode portions 12. Each first island-like electrode portion 12 is formed in a rectangular shape in a plan view and arranged such that one diagonal line thereof extends along the X axis.

Each Y electrode film 20 includes, as separate members (i.e., members formed in separate steps), a plurality of second island-like electrode portions 22 arranged in the Y axis direction and second bridge wiring portions 21 each connecting the adjacent second island-like electrode portions 22. Each second island-like electrode portion 22 is formed in a rectangular shape in a plan view and arranged such that one diagonal line thereof extends along the Y axis. The first island-like electrode portions 12 and the second island-like electrode portions 22 are arranged alternately with each other in the X axis direction and the Y axis direction, (arranged in a checkered pattern). In the input region 2, the rectangular first and second island-like electrode portions 12 and 22 are arranged in a matrix pattern in a plan view. The X electrode films 10 and the Y electrode films 20 intersect each other at intersection portions K within the input region 2 by causing the first bridge wiring portions 11 and the second bridge wiring portions 21 to intersect each other.

In addition, the X electrode films 10 and the Y electrode films 20 intersect each other with insulating films 30 interposed therebetween, the insulating films 30 being formed on the first bridge wiring portions 11 of the X electrode films 10, thereby ensuring insulation between the X electrode films 10 and the Y electrode films 20.

Meanwhile, in forming an electrode or the like on a substrate, if an electrode film or the like is formed by repeating a sputtering method, a photolithography method, an etching method, or the like a plurality of times, the manufacturing cost is increased. Thus, it is conceivable that an electrode film or the like is formed by using a printing method or the like, but also in this case, in forming a conductive film between electrode films via an insulating layer, if the area of connection of the conductive film to each electrode film is small, the contact resistance therebetween is increased.

In the invention described in Patent Document 1, as a solution to the above-described problem, as shown in (b) of FIG. 27, the film width W1 of each second, bridge wiring portion 21 formed on the insulating film 30 is made different from the film width W2 of each second bridge wiring portion 21 formed on the second island-like electrode portion 22, such that the film width W2 of each second bridge wiring portion 21 formed on the second island-like electrode portion 22 is larger than the film width W1 of each second bridge wiring portion 21 formed on the insulating film 30. By increasing the area of connection between each second bridge wiring portion 21 and each second island-like electrode portion 22, the contact resistance between each second bridge wiring portion 21 and each second island-like electrode portion 22 is attempted to be reduced.

It should be noted that the film width W1 of each second bridge wiring portion 21 formed on the insulating film 30 is set so as to be smaller than the interval W3 between the first island-like electrode portions 12 adjacent thereto. This is for dealing with causing the pitch between each first island-like electrode portion 12 to be fine, ensuring a desired interval between each second bridge wiring portion 21 and each first island-like electrode portion 12, and preventing contact between each second bridge wiring portion 21 and each first island-like electrode portion 12.

Patent Document 1: Japanese Patent Laid-open Publication No. 2011-13725

SUMMARY OF THE INVENTION

Problems to be Solved by the Invention

However, even in the invention described in Patent Document 1, complexity of a step of forming each pattern has still not been eliminated. In addition, if each first bridge wiring portion 11, the insulating film 30 on the first bridge wiring portion 11, and the second bridge wiring portion 21 on the first bridge wiring portion 11 and the insulating film 30 are formed such that a positional relation thereamong is deviated from a desired positional relation in forming each portion, conduction between the second island-like electrode portion and the second bridge wiring portion of the second electrode film becomes poor, or insulation between the first electrode film and the second electrode film becomes poor.

Therefore, an object of the present invention is to solve the above-described problems and to provide a touch sensor and a manufacturing method for the same in which a step of forming each pattern is simple and poor conduction or poor insulation due to misalignment in pattern formation is less likely to occur; and a transfer ribbon for touch sensor manufacturing.

Means for Solving the Problems

The first embodiment of the present invention provides a touch sensor comprising a plurality of first electrode films and a plurality of second electrode films which are formed on a surface of a substrate and are arranged in different directions from each other, wherein each first electrode film integrally includes:
　　　　a plurality of first island-like electrode portions formed so as to be spaced apart from each other in a first direction on the substrate; and
　　　　first bridge wiring portions each formed so as to be electrically connected between the adjacent first island-like electrode portions,
　　a first insulating film is further formed on each first electrode film so as to cover entireties of the first island-like electrode portions and the first bridge wiring portions,
　　each second electrode film integrally includes:
　　　　a plurality of second island-like electrode portions formed so as to be spaced apart from each other in a second direction different from the first direction on the substrate; and
　　　　second bridge wiring portions each formed via a portion of the first insulating film that covers the first bridge wiring portion, so as to be electrically connected between the adjacent second island-like electrode portions, and
　　a second insulating film is further formed on each second electrode film so as to cover entireties of the second island-like electrode portions and the second bridge wiring portions.

The second embodiment of the present invention provides the touch sensor of the first embodiment, wherein the substrate is composed of a resin film.

The third embodiment of the present invention provides the touch sensor of the first or second embodiment, further comprising routing wires integrally extending from the first electrode films and the second electrode films, wherein the first insulating film and the second insulating film are also formed on each routing wire so as to cover an entirety thereof except for a terminal portion thereof.

The fourth embodiment of the present invention provides the touch sensor of the first or second embodiment, further comprising routing wires electrically connected to one ends of the first electrode films and the second electrode films from a side opposite to the substrate.

The fifth embodiment of the present invention provides the touch sensor of the first or second embodiment, further comprising routing wires electrically connected to one ends of the first electrode films and the second electrode films from a substrate side.

The sixth embodiment of the present invention provides the touch sensor of the first to fifth embodiment, wherein each of the first insulating films and the second insulating films contains a rust preventive.

The seventh embodiment of the present invention provides a manufacturing method for the touch sensor of the first to sixth embodiment, the manufacturing method comprising:

a first transfer step of using a transfer ribbon formed by sequentially laminating at least an insulating layer and an electrode-imparting layer as transfer layers on an entirety of a surface of a long release film, superimposing the transfer ribbon on the substrate such that the release film is located at an outer side, partially applying thermal pressure thereto from the release film side, thereby adhering only portions of the transfer layers to which the thermal pressure is applied, to the substrate, and separating the release film therefrom, thereby transferring the transfer layers into at least shapes of the first electrode films; and
　　a second transfer step of, after the first transfer step, using a transfer ribbon having the same configuration as that in the first transfer step, superimposing the transfer ribbon on the substrate and the layers transferred in the first transfer step such that the release film is located at an outer side, partially applying thermal pressure thereto from the release film side, thereby adhering only portions of the transfer layers to which the thermal pressure is applied onto the substrate and the layers transferred in the first transfer step, and separating the release film therefrom, thereby transferring the transfer layers into at least shapes of the second electrode films.

The eighth embodiment of the present invention provides the manufacturing method for the touch sensor of the seventh embodiment, wherein in the first transfer step, the transfer layers are transferred into a shape including not only the first electrode film but also the routing wires extending from the first electrode films; and
　　in the second transfer step, the transfer layers are transferred into a shape including not only the second electrode films but also the routing wires extending from the second electrode films.

The ninth embodiment of the present invention provides the manufacturing method for the touch sensor of the seventh embodiment, further comprising a routing wire forming step of, after the second transfer step, forming the routing wires electrically connected to the one ends of the first electrode films and the second electrode films.

The tenth embodiment of the present invention provides the manufacturing method for the touch sensor of the seventh embodiment, further comprising a routing wire forming step of, before the first transfer step, previously forming the routing wires such that the routing wires are electrically connected to the one ends of the first electrode films and the second electrode films.

The eleventh embodiment of the present invention provides a transfer ribbon for use in the manufacturing method for the touch sensor of the seventh to tenth embodiment, wherein the transfer ribbon is formed by sequentially laminating at least an insulating layer and an electrode-imparting layer as transfer layers on an entirety of a surface of a long release film.

The twelfth embodiment of the present invention provides any touch sensor of the first to sixth embodiments, further comprising a polarizer at a front surface of the touch sensor.

Advantageous Effects of the Invention

In the capacitance type touch sensor according to the present invention having an XY electrode configuration on a single surface (i.e., a configuration including a plurality of first electrode films and a plurality of second electrode films which are formed on a surface of a substrate and are arranged in different directions from each other), the first electrode films and the insulating films covering the first electrode films are simultaneously formed by the above-described heat transfer method, then likewise the second electrode films and the insulating films covering the second electrode films are simultaneously formed by the heat transfer method, and thus the step for forming each pattern is simple.

In addition, in the obtained touch sensor, at least the first insulating films are formed on the first electrode films in the same shapes as the first island-like electrode portions and the first bridge wiring portions of the first electrode films, and thus insulation of the surface of each first electrode film is completely ensured in an input region. Therefore, even when the second electrode films formed thereon are misaligned, a problem of poor insulation does not occur.

Moreover, regarding each second electrode film, the plurality of second island-like electrode portions and the second bridge wiring portions each formed so as to be electrically connected between the adjacent second island-like electrode portions are not formed in separate steps, namely, are integrated with each other to form a film, and thus a problem of poor conduction due to misalignment as in the conventional art does not occur.

BRIEF DESCRIPTION OF THE DRAWINGS

FIG. 12 It is an explanatory view showing a manufacturing process of the touch sensor according to the first embodiment.

FIG. 13 It is across-sectional view showing the configuration of a transfer ribbon to be used in the present invention.

FIG. 16 It is an explanatory view showing a manufacturing process of the touch sensor according to the second embodiment.

FIG. 17 It is an explanatory view showing a manufacturing process of the touch sensor according to the second embodiment.

FIG. 20 It is an explanatory view showing a manufacturing process of the touch sensor according to the second embodiment.

FIG. 21 It shows the configuration of a touch sensor according to the third embodiment, in which (a) is a fragmentary plan view and (b) is an A-A' line cross-sectional view thereof.

MODE FOR CARRYING OUT THE INVENTION

First Embodiment

Figure 1:
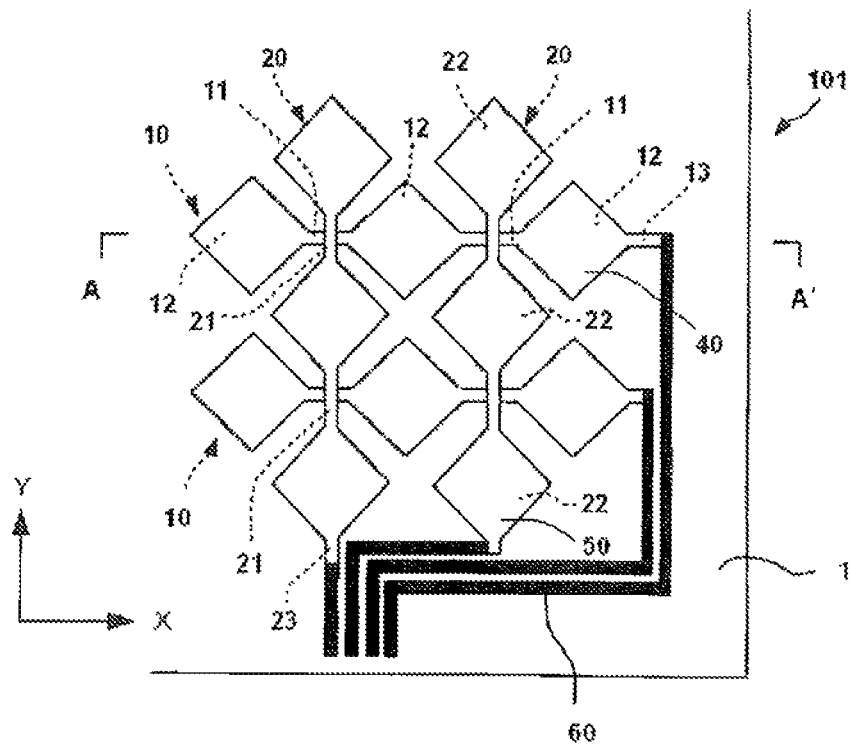
FIG. 1 It is a fragmentary plan view showing the configuration of a touch sensor according to the first embodiment.
Figure 2:
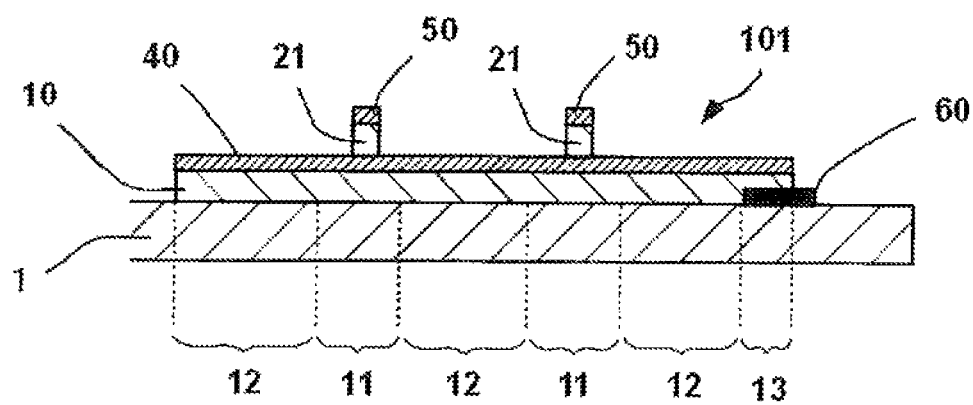
FIG. 2 It is an A-A' cross-sectional view of FIG. 1.

Hereinafter, an embodiment of a touch sensor according to the present invention will be described with reference to the drawings. FIG. 1 is a partially enlarged plan view showing an example of the touch sensor according to the present invention. FIG. 2 is an A-A' cross-sectional view of FIG. 1.

A touch sensor 101 shown in FIG. 1 includes X electrode films 10 as a plurality of first electrode films and Y electrode films 20 as a plurality of second electrode films on one surface of one substrate.

The substrate 1 is an electrically insulating substrate and may be, for example, a glass substrate, a PET (polyethylene terephthalate) film, a PC (polycarbonate) film, a COP (cycloolefin polymer) film, a PVC (polyvinyl chloride) film, or the like. In particular, the COP film is preferred since it is excellent not only in optical isotropy but also in dimensional stability and further processing accuracy. It should be noted that when the substrate 1 is a glass substrate, the thickness of the substrate 1 may be 0.3 mm to 3 mm. In addition, when the substrate 1 is a resin film, the thickness of the substrate 1 may be 20 μm to 3 mm.

A plurality of the X electrode films 10 extend along an X axis direction as a first direction as shown and are spaced apart from each other in a Y axis direction. A plurality of the Y electrode films 20 extend along the Y axis direction as a second direction as shown and are spaced apart from each other in the X axis direction.

Each X electrode film 10 integrally includes a plurality of first island-like electrode portions 12 arranged in the X axis direction and first bridge wiring portions 11 each electrically connecting the adjacent first island-like electrode portions 12. Each first island-like electrode portion 12 is formed in a rectangular shape in a plan view and arranged such that one diagonal line thereof extends along the X axis.

Each Y electrode film 20 integrally includes a plurality of second island-like electrode portions 22 arranged in the Y axis direction and second bridge wiring portions 21 each connecting the adjacent second island-like electrode portions 22. Each second island-like electrode portion 22 is formed in a rectangular shape in a plan view and arranged such that one diagonal line thereof extends along the Y axis. The first island-like electrode portions 12 and the second island-like electrode portions 22 are arranged alternately with each other in the X axis direction and the Y axis direction (arranged in a checkered pattern), and the rectangular first and second island-like electrode portions 12 and 22 are arranged in a matrix pattern in a plan view. The X electrode films 10 and the Y electrode films 20 intersect each other by causing the first bridge wiring portions 11 and the second bridge wiring portions 21 to intersect each other.

As the material forming the X electrode films 10 and the Y electrode films 20, a composite material in which ultrafine conductive carbon fibers such as carbon nanotubes, carbon nanotubes, carbon nanowires, carbon nanofibers, or graphite fibrils or ultrafine conductive fibers made of a silver material are dispersed in a polymer material that serves as a binder, may be used. Here, as the polymer material a conductive polymer such as polyaniline, polypyrrole, polyacethylene, polythiophene, polyphenylene vinylene, polyphenylene sulfide, poly(p-phenylene), poly(heterocyclic vinylene), and PEDOT; poly(3,4-ethylenedioxythiophene) may be used. In addition, a non-conductive polymer such as polyethylene terephthalate (PET), polyethylene naphthalate (PEN), polyether sulfone (PES), polyether ether ketone (PEEK), polycarbonate (PC), polypropylene (PP), polyamide (PA), acrylic, polyimide, epoxy resin, phenol resin, aliphatic cyclic polyolefin, and norbornene-based transparent thermoplastic resin may be used. In addition, graphene may also be used as die material forming the X electrode films 10 and the Y electrode films 20.

In addition, in the present embodiment, each of the X electrode films 10 and the Y electrode films 20 integrally includes, at one end thereof, a connection portion 13 or 23 connected to a routing wire 60.

In the case where a carbon nanotube composite material in which carbon nanotubes are dispersed in a non-conductive polymer material is particularly used as the material of the X electrode films 10 and the Y electrode films 20, since the carbon nanotubes generally have a diameter of 0.8 nm to 1.4 nm (about 1 nm) and are very fine, when the carbon nanotubes are dispersed in the non-conductive polymer material individually or per bundle thereof, the carbon nanotubes are less likely to impair light transmission, and thus the carbon nanotube composite material is preferred in ensuring the transparency of the X electrode films 10 and the Y electrode films 20. It should be noted that in the present invention, the X electrode films 10 and the Y electrode films 20 are not limited to transparent films.

Each routing wire 60 is formed on a peripheral portion of the substrate 1 and connected at one end thereof to the connection portion 13 or 23 of the X electrode film 10 or the Y electrode film 20 from the substrate 1 side. In addition, each routing wire 60 is connected at another end thereof to a drive portion and an electrical signal conversion/calculation portion (illustration of both portions is omitted) provided within the touch sensor 101 or in an external device.

As the material of each routing wire 60, silver (Ag), copper (Cu), chromium (Cr), aluminum (Al), a composite metal layer of molybdenum/aluminum/molybdenum (Mo/Al/Mo), an alloy thereof, or the like may be used.

Next, the configuration of the touch sensor 101 in a cross-sectional view will be described. As shown in FIG. 2, the X electrode films 10, which include the first island-like electrode portions 12, the first bridge wiring portions 11, and the connection portions 13, and the Y electrode films 20, which include the second, island-like electrode portions 22 (not shown), the second bridge wiring portions 21, and the connection portions 23 (not shown), are provided on a functional surface 1a as the one surface of the substrate 1. Unlike the conventional art, a first insulating film 40 is formed on each X electrode film 10 so as to cover the entirety of the X electrode film 10, namely, so as to completely conform to the shape of the X electrode film 10. Each second bridge wiring portion 21 of each Y electrode film 20 is formed on the first bridge wiring portion 11 of the X electrode film 10 so as to intersect the first bridge wiring portion 11 via the first insulating film 40, and insulation at the intersection portion of each X electrode film 10 and each Y electrode film 20 is ensured by the first insulating film 40.

In addition, unlike the conventional art, each second bridge wiring portion 21 of each Y electrode film 20 is a film integrated with the second island-like electrode portions 22 (namely, not formed in a step separate from that for the second island-like electrode portions 22), similarly to the X electrode films 10. Thus, a problem of poor conduction due to misalignment of the second island-like electrode portion 22 and the second bridge wiring portion 21 as in the conventional art does not occur. The reason why each Y electrode film 20 can be configured such that the second bridge wiring portions 21 and the second island-like electrode portions 22 are integrated with each other is that each of the X electrode films 10 and the Y electrode films 20 is formed by a heat transfer method as described later. It should be noted that as a transfer ribbon used in the heat transfer, the same transfer ribbon is used for forming the X electrode films 10 and for forming the Y electrode films 20, and thus unlike the conventional art, a second insulating film 50 is formed on each Y electrode film 20 so as to cover the entirety of the Y electrode film 20, namely, so as to completely conform to the shape of the Y electrode film 20.

As the material of the first insulating films 40 and the second insulating films 50, for example, an inorganic material such as $SiO_2$ or an organic resin material such as a resin for photolithography may be used.

Here, the principal of operation of the touch sensor 101 will be described. The touch sensor 101 is attached to a back surface of, in general, a protective substrate, for example, a glass plate, when being used. First, a predetermined potential is supplied to the X electrode films 10 and the Y electrode films 20 via the routing wires 60 from the drive portion whose illustration is omitted.

In a state where the potential is supplied as described above, when a finger is moved close to an input region from the protective substrate side, a parasitic capacitance is formed between the finger that has been moved close to the protective substrate, and the X electrode films 10 and the Y electrode films 20 that are near a position to which the finger has been moved close. Then, at the X electrode films 10 and the Y electrode films 20 at which the parasitic capacitance is formed, a temporal fall in potential is caused to charge the parasitic capacitance.

The drive portion senses the potential of each electrode and immediately detects the X electrode films 10 and the Y electrode films 20 at which the above fall in potential has occurred. Then, the position of the detected electrode is analyzed by the electrical signal conversion/calculation portion, thereby detecting position information of the finger in the input region 2. Specifically, a Y coordinate in the input region of the position to which the finger has got close is detected by the X electrode films 10 extending in the X axis direction, and an X coordinate in the input region of the position is detected by the Y electrode films 20 extending in the Y axis direction.

Manufacturing Method for Touch Sensor

Hereinafter, a manufacturing method for the touch sensor will be described. The manufacturing process for the touch sensor 101 of the present embodiment includes a routing wire forming step, a first transfer step, and a second transfer step.

Figure 3:
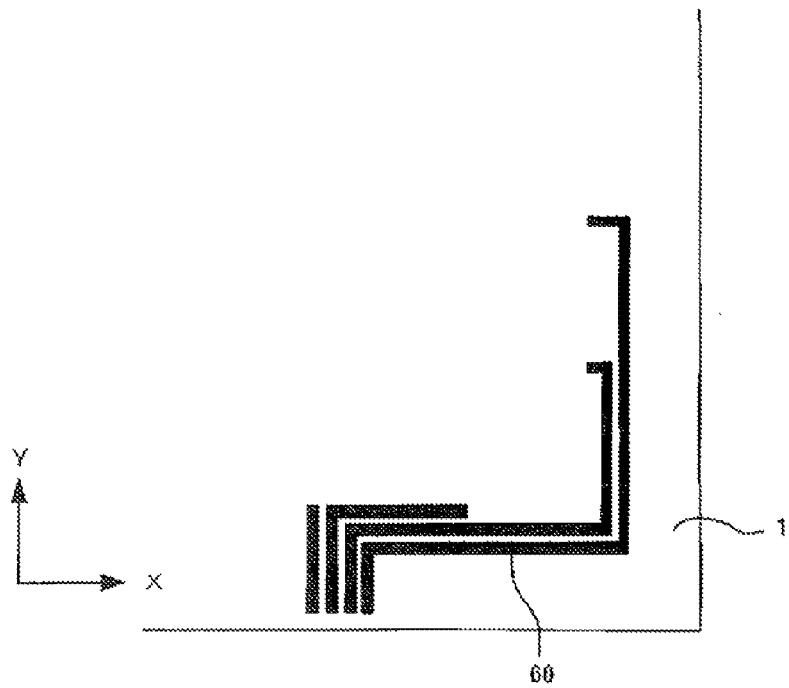
FIG. 3 It is an explanatory view showing a manufacturing process of the touch sensor according to the first embodiment.
Figure 4:
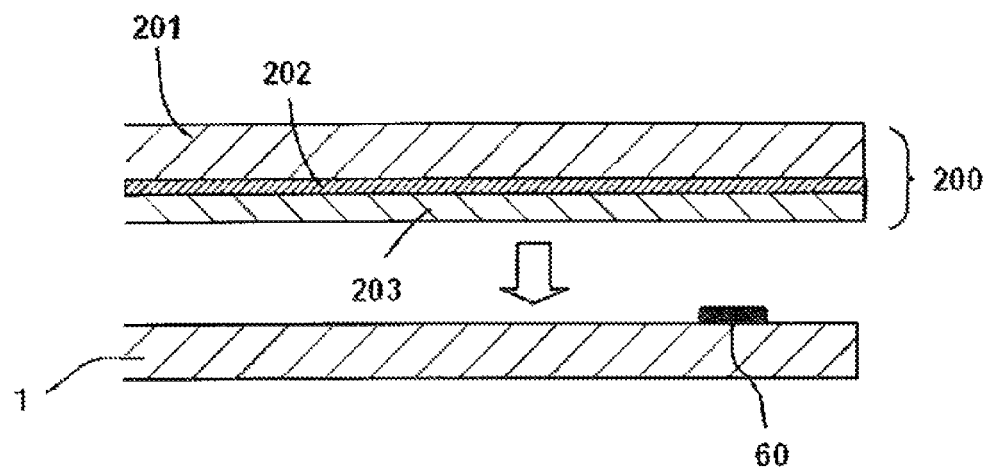
FIG. 4 it is an explanatory view showing a manufacturing process of the touch sensor according to the first embodiment.
Figure 5:
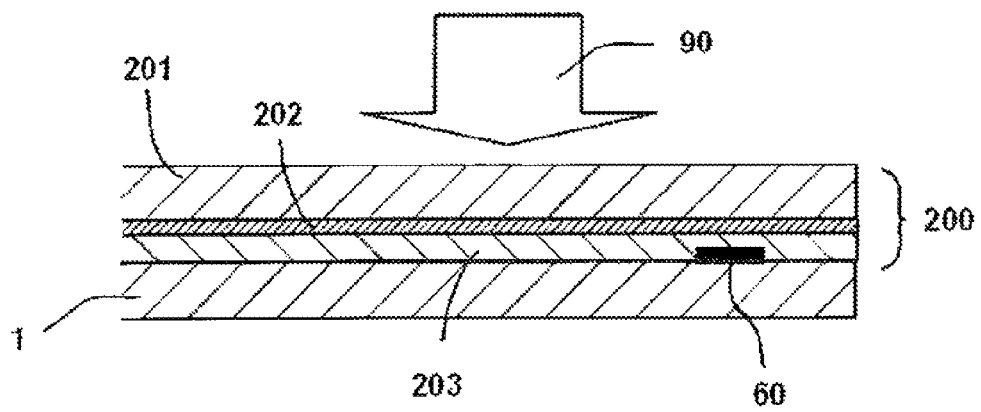
FIG. 5 It is an explanatory view showing a manufacturing process of the touch sensor according to the first embodiment.
Figure 6:
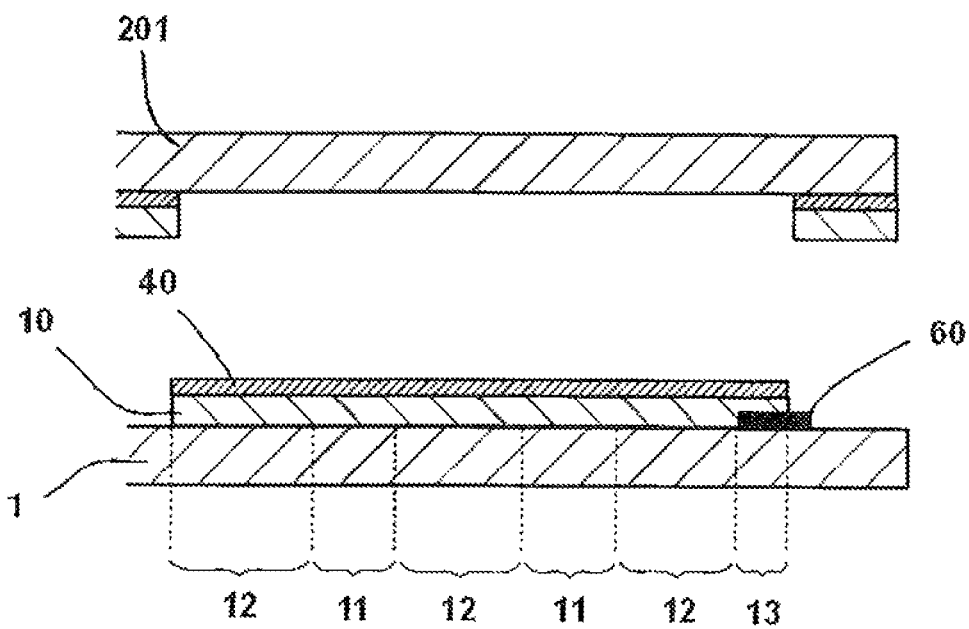
FIG. 6 It is an explanatory view showing: a manufacturing process of the touch sensor according to the first embodiment.
Figure 7:
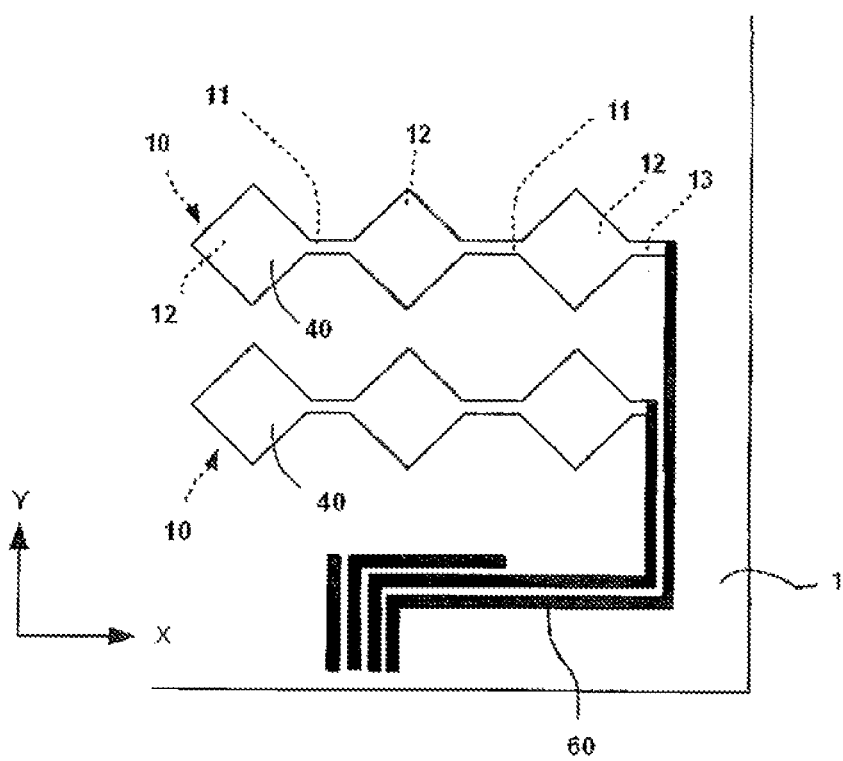
FIG. 7 It is an explanatory view showing a manufacturing process of the touch sensor according to the first embodiment.

First, the routing wire forming step (see FIG. 3) is a step of forming the routing wires 60 on the one surface of the one substrate 1. More specifically, the routing wire forming step includes: a film forming step of entirely forming a metal film on the substrate 1 by a sputtering method or the like; and a patterning step of forming the metal film into a predetermined pattern shape by a photolithography technique to form the routing wires 60.

Other than the sputtering method, the method for forming the metal film may be a PVD method such as a vacuum evaporation method or an ion plating method, a CVD method, lamination of metal foil, or the like. When molybdenum and aluminum are used, it is preferred to form a three-layer structure of molybdenum/aluminum/molybdenum.

In the photolithography, a photosensitive substance called photoresist is applied to the surface of a coating film as a target, then exposed to light in a pattern form, and developed, thereby generating a pattern including portions covered with the resist and portions not covered with the resist, and the coating film at the portions not covered with the resist is removed by etching. Since the portions covered with the resist are not removed by etching, a pattern that is desired to remain is formed. Finally, the resist is completely removed by a solvent or the like.

Next, the process shifts to the first transfer step (see FIGS. 4 to 7). In the first transfer step, a transfer ribbon 200 (see FIG. 13) formed by sequentially laminating an insulating layer 202 and an electrode-imparting layer 203 as transfer layers on the entirety of a surface of a long release film 201 is used and superimposed on the substrate 1 on which the routing wires 60 have been formed, such that the release film 201 is located at the outer side (see FIG. 4). Thermal pressure 90 is partially applied thereto from the release film 201 side, thereby adhering only portions of the transfer layers to which the thermal pressure is applied, to the substrate 1 (see FIG. 5), and the release film 201 is separated therefrom, thereby transferring the transfer layers into the shapes of the X electrode films 10 as a plurality of the first electrode films. At that time, the X electrode films 10 and insulating films covering the X electrode films 10, namely, the first insulating films 40, are simultaneously formed (see FIGS. 6 and 7).

Examples of the material of the release film 201 include resin films of acrylic, polycarbonate, polyethylene terephthalate, polybutylene terephthalate, polypropylene, polyamide, polyurethane, polyvinyl chloride, polyvinyl fluoride, and the like. Among them, a biaxially stretched polyethylene terephthalate film having excellent dimensional stability is particularly preferred. The release surface of the release film 201 is preferably subjected to release treatment. The release treatment may result in a silicone release-treated surface or a non-silicone release-treated surface.

The thickness of the release film 201 is preferably 6 to 10 µm. If the thickness of the release film 201 exceeds 10 µm, it is made difficult to control heat due to diffusion of heat, and thus heat is transmitted to an unwanted portion and a desired pattern is hard to obtain. However, when a special material having thermal conductivity anisotropy is used for the release film 201, the thickness of the release film 201 can be larger than 10 µm. When the thick release film 201 can be used, coating is made easy. As a result, the transfer ribbon can be expected to be inexpensive. In addition, if the thickness of the release film 201 is less than 6 µm, it is difficult to handle the release film 201, and the productivity is decreased.

The material of the insulating layer 202 is as described above as the material of the first insulating films 40 and the second insulating films 50. In a method for forming the insulating layer 202, a polysiloxane, an acrylic resin, an acrylic monomer, or the like is applied by using, for example, a printing method or the like, and dried to be solidified, thereby forming the insulating layer 202. When the insulating layer 202 is formed by using a polysiloxane, the insulating layer 202 becomes an inorganic insulating film made of a silicon oxide. Meanwhile, when an acrylic resin or an acrylic monomer is used, the insulating layer 202 becomes an organic insulating film made of a resin material.

The material of the electrode-imparting layer 203 is as described above as the material of the X electrode films 10 and the Y electrode films 20. These materials have excellent flexibility, and when the substrate 1 is a resin film, the touch sensor 101 can be attached along a 2.5-dimensional curved surface or a three-dimensional curved surface. As a method for forming the electrode-imparting layer 203, for example, a coating method, a printing method, an inkjet method, or the like may be used when the above-described composite material in which ultrafine conductive carbon fibers or ultrafine conductive fibers made of a silver material are dispersed in a polymer material that serves as a binder is used.

Figure 8:
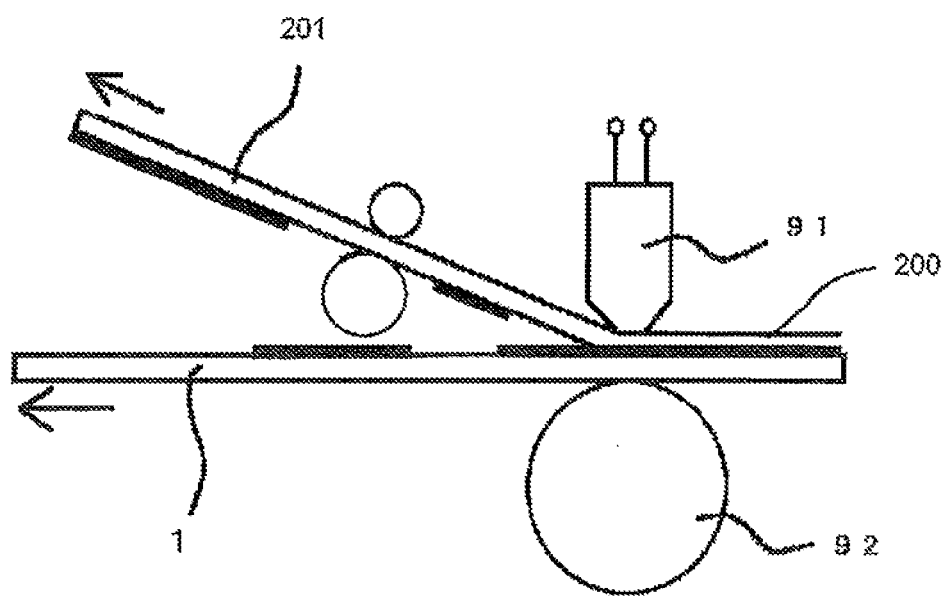
FIG. 8 It is a view explaining a thermal transfer method.
Figure 9:
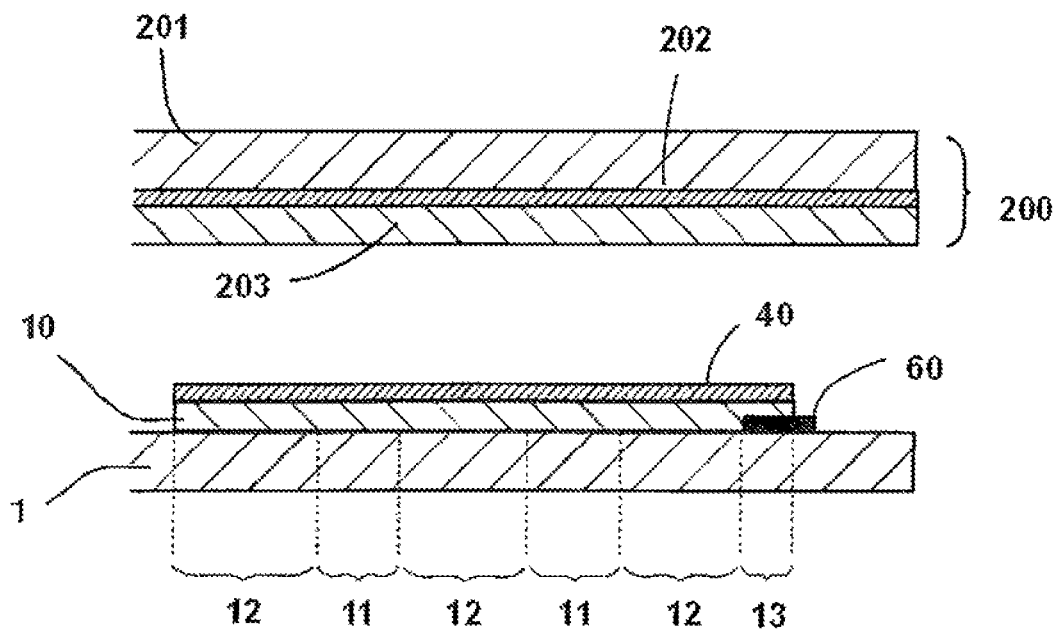
FIG. 9 It is an explanatory view showing a manufacturing process of the touch sensor according to the first embodiment.
Figure 10:
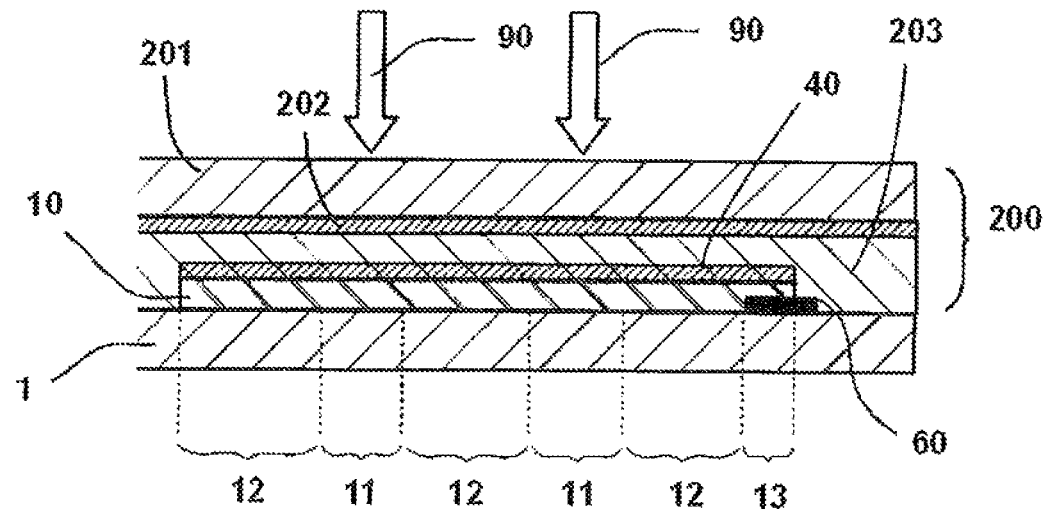
FIG. 10 It is an explanatory view showing a manufacturing process of the touch sensor according to the first embodiment.
Figure 11:
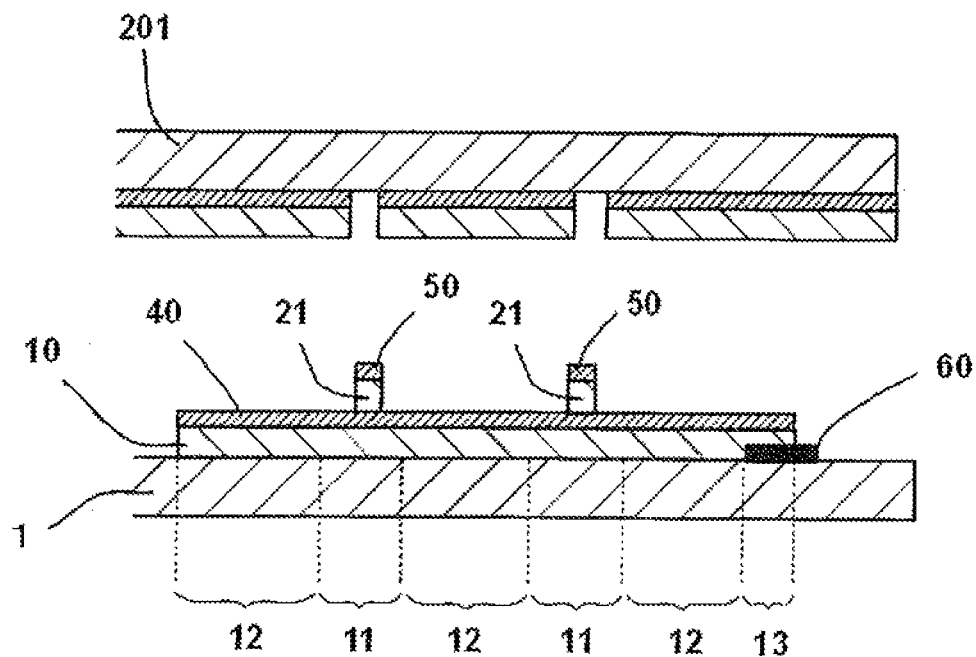
FIG. 11 It is an explanatory view showing a manufacturing process of the touch sensor according to the first embodiment.

Examples of means for applying thermal pressure to such a transfer ribbon 200 include a thermal head 91 for use in a heat transfer printer or the like (see FIG. 8). Specifically, the transfer ribbon 200 and the substrate 1 on which the routing wires 60 have been formed are nipped between a platen roller 92 and a heating resistor element of the thermal head 91, and the platen roller 92 is rotated to transfer the transfer ribbon 200 and the substrate 1 on which the routing wires 60 have been formed, while the heating resistor element of the thermal head 91 is selectively heated in accordance with information of an electrode pattern and the transfer layers of the transfer ribbon 200 are thermally transferred onto the substrate 1. It should be noted that a plurality of thermal heads 91 may be simultaneously used.

Finally, the process shifts to the second transfer step (see FIGS. 9 to 12). The second transfer step is the same as the first transfer step except for a pattern in which thermal pressure is applied. Specifically, in the second transfer step, a transfer ribbon 200 having the same configuration as that used in the first transfer step is used and superimposed on the substrate 1 and the layers transferred in the first transfer step (the X electrode films 10 and the first insulating films 40) (see FIG. 9), thermal pressure is partially applied thereto from the release film 201 side, thereby adhering only portions of the transfer layers to which the thermal pressure is applied, to the substrate 1 and the layers transferred in the first transfer step (see FIG. 10), and the release film 201 is separated therefrom, thereby transferring the transfer layers into the shapes of the Y electrode films 20 as a plurality of the second electrode films. At that time, the Y electrode films 20 and insulating films covering the Y electrode films 20, namely, the second insulating films 50, are simultaneously formed (see FIGS. 11 and 12).

Although the preferred embodiment according to the present invention has been described above with reference to the accompanying drawings, it is needless to say that the present invention is not limited to the example. The shapes, combination, and the like of the components described in the above example are merely examples, and various modifications can be made based on design requirements and the like without departing from the gist of the present invention.

Second Embodiment

Next, a second embodiment will be described. It should be noted that the description of components common to those of the first embodiment is omitted and components only according to the second embodiment will be described.

Figure 14:
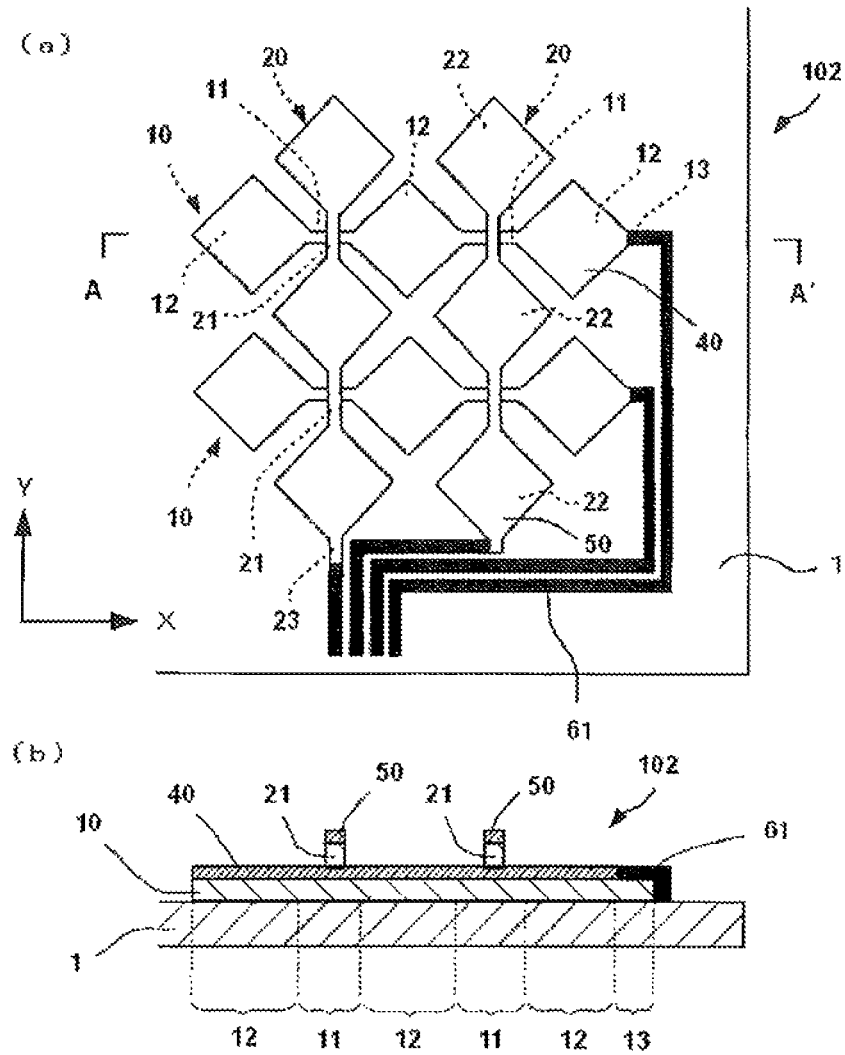
FIG. 14 It shows the configuration of a touch sensor according to the second embodiment, in which (a) is a fragmentary plan view and (b) is an A-A' line cross-sectional view thereof.

Each routing wire 60 of the first embodiment is connected to the one end of the X electrode film 10 or the Y electrode film 20 from the substrate 1 side, but in the second embodiment, each routing wire 61 is configured to be connected to one end of the X electrode film 10 or the Y electrode film 20 from a side opposite to the substrate 1 (see FIG. 14).

Figure 15:
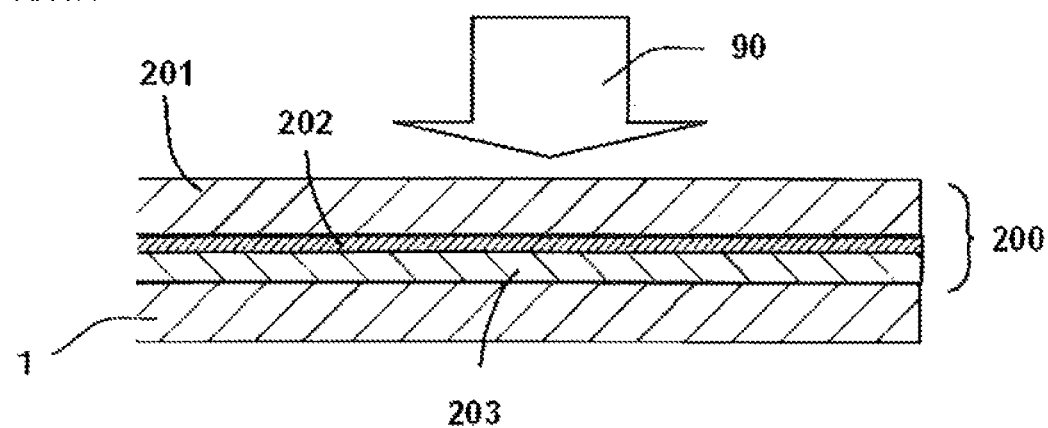
FIG. 15 It is an explanatory view showing a manufacturing process of the touch sensor according to the second embodiment.
Figure 18:
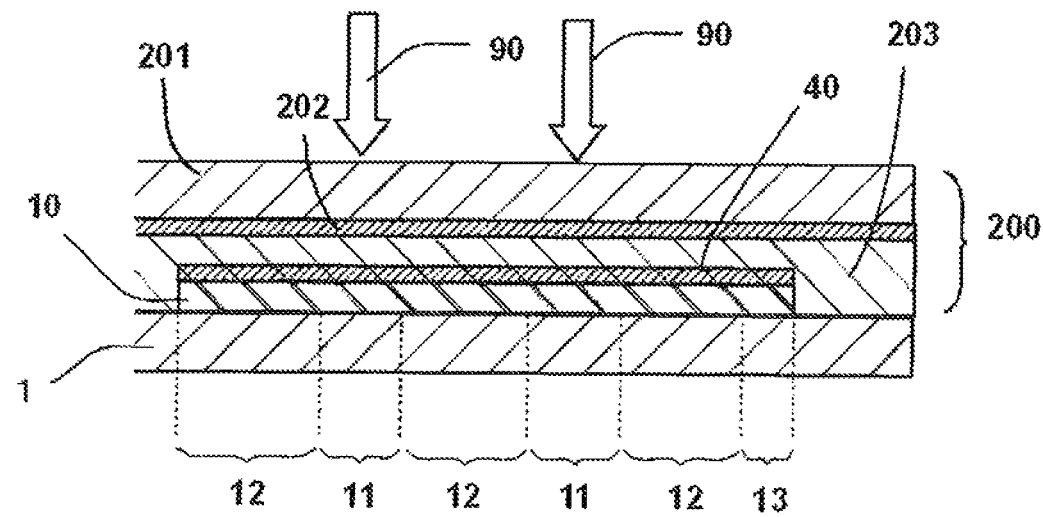
FIG. 18 It is an explanatory view showing a manufacturing process of the touch sensor according to the second embodiment.
Figure 19:
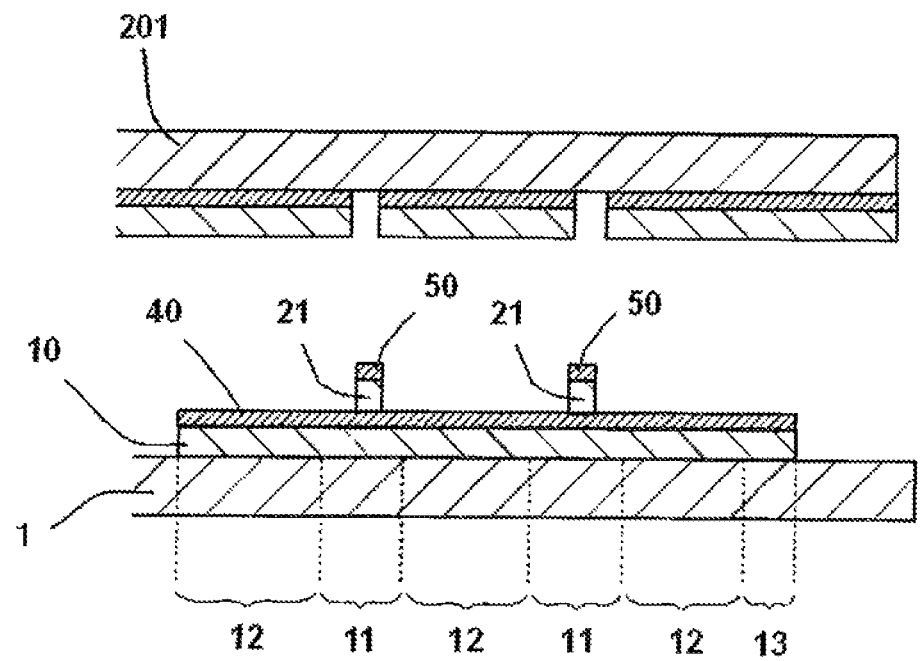
FIG. 19 It is an explanatory view showing a manufacturing process of the touch sensor according to the second embodiment.

In this case, in the manufacturing process for a touch sensor 102, first, a first transfer step (see FIGS. 15 to 17) and a second transfer step (see FIGS. 18 to 20) are conducted, and then a routing wire forming step (see FIG. 14) is conducted. In the routing wire forming step, the routing wires 61 are pattern-formed by screen printing or the like using a metal paste such as gold, silver, or copper. Meanwhile, after the first transfer step and the second transfer step, an insulating film is present on the connection portions 13 and 23 of the X electrode films 10 and the Y electrode films 20. However, thereafter, in forming the routing wires 61, portions of the insulating film that overlap the rooting wires 61 are dissolved and removed by a solvent in the metal paste. Thus, conduction between the X electrode films 10 and the Y electrode films 20, and the rooting wires 61 is possible. As a matter of course, before the routing wires 61 are formed, the portions of the insulating film that are to be overlapped with the routing wires 61 may be previously removed.

It should be noted that the routing pattern formation conducted in the second embodiment by screen printing using the metal paste is less suitable for the routing wire forming step of the first embodiment. This is because the thicknesses of the routing wires obtained by this method are larger than those of the X electrode films 10 and the Y electrode films 20 transferred thereonto later and thus a great step occurs between a portion where each routing wire is formed and a portion where no routing wire is formed, which may result in the X electrode film 10 or the Y electrode film 20 being disconnected at the step, or "bubble entrainment", that is, bubbles remaining at the step in the first transfer step or the second transfer step.

Third Embodiment

Next, a third embodiment will be described. It should be noted that the description of components common to those of the first and second embodiments is omitted and components only according to the third embodiment will be described.

Each of the routing wires 60 and 61 of the first and second embodiments is connected to the one end of the X electrode film 10 or the Y electrode film 20 from the substrate 1 side or from the side opposite to the substrate 1, but in the third embodiment, each routing wire 62 is configured to extend from the X electrode film 10 or the Y electrode film 20 and be formed as a film integrated therewith. In other words, the material of the routing wires 62 is the same as that of the X electrode films 10 and the Y electrode films 20. In addition, the first insulating films 40 and the second insulating films 50 are formed on the routing wires 62 so as to cover the entireties thereof except for terminal portions thereof (see FIG. 21).

Figure 22:
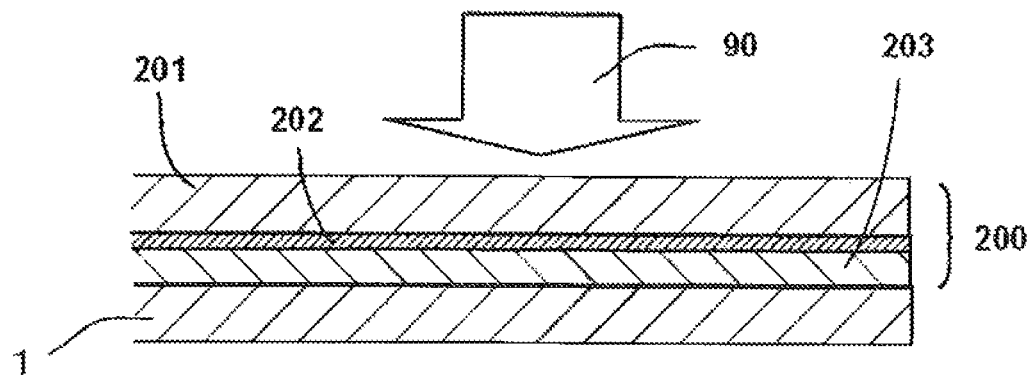
FIG. 22 It is an explanatory view showing a manufacturing process of the touch sensor according to the third embodiment.
Figure 23:
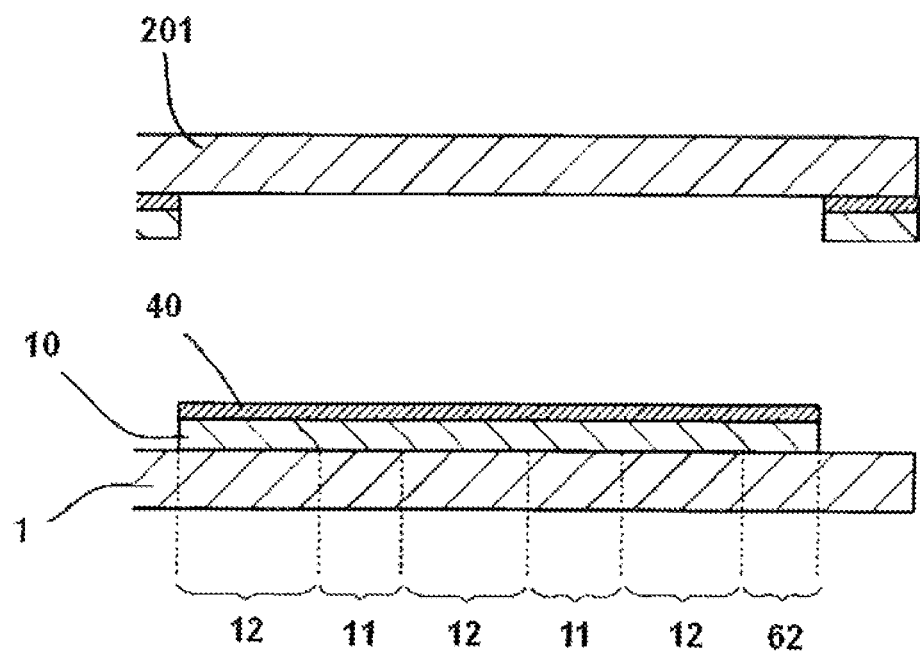
FIG. 23 It is an explanatory view showing a manufacturing process of the touch sensor according to the third embodiment.
Figure 24:
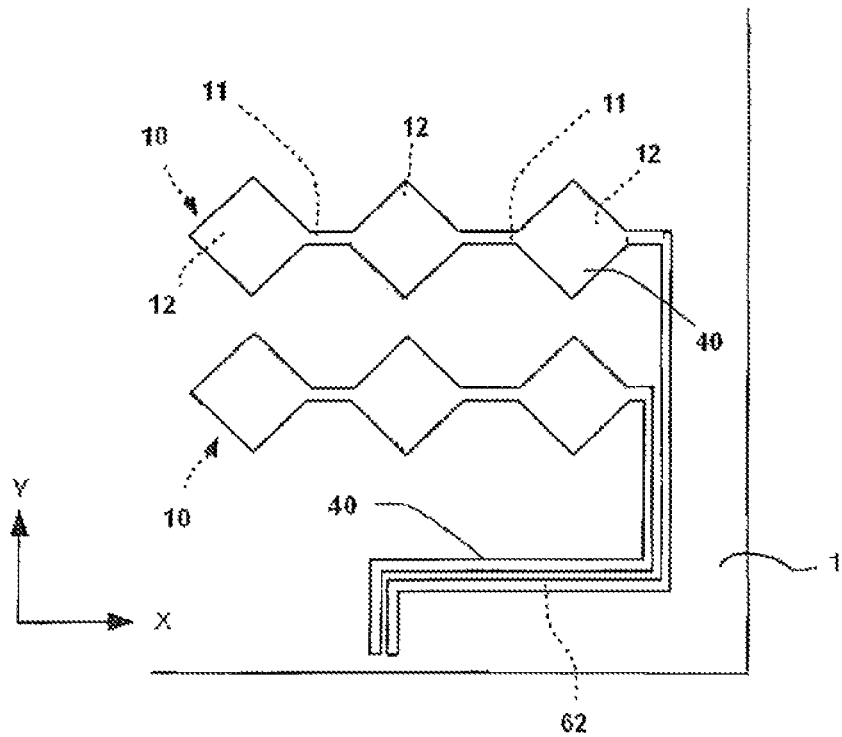
FIG. 24 It is an explanatory view showing a manufacturing process of the touch sensor according to the third embodiment.
Figure 25:
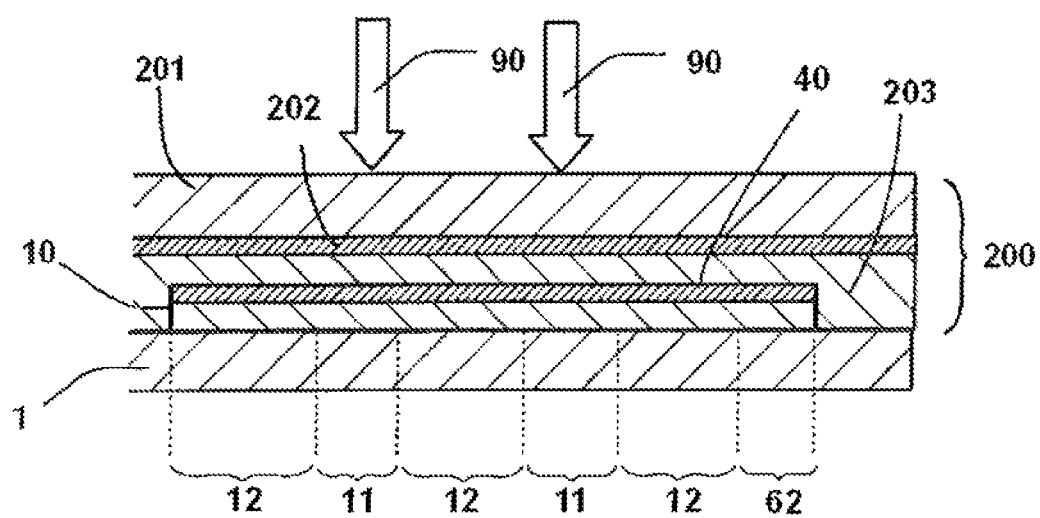
FIG. 25 It is an explanatory view showing a manufacturing process of the touch sensor according to the third embodiment.
Figure 26:
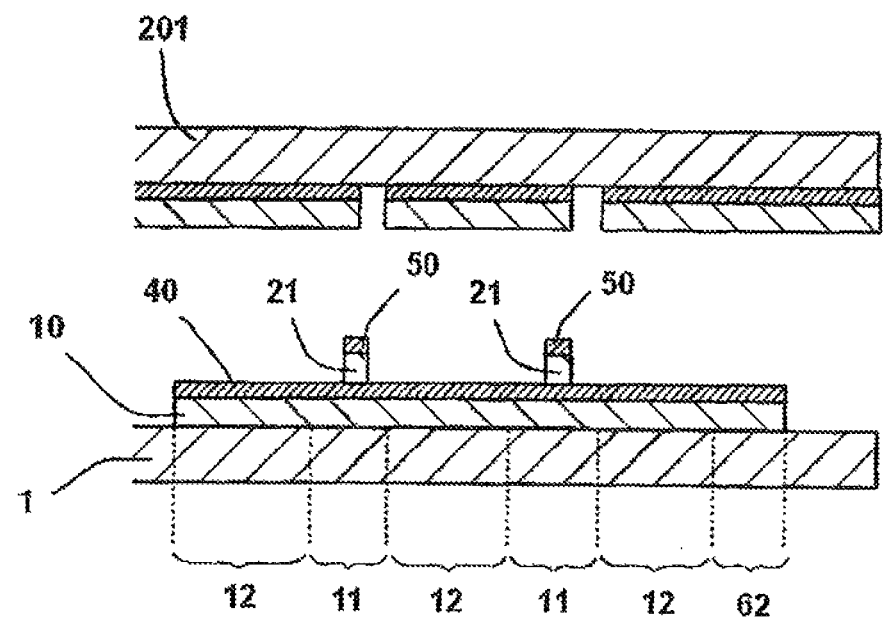
FIG. 26 It is an explanatory view showing a manufacturing process of the touch sensor according to the third embodiment.
Figure 27:
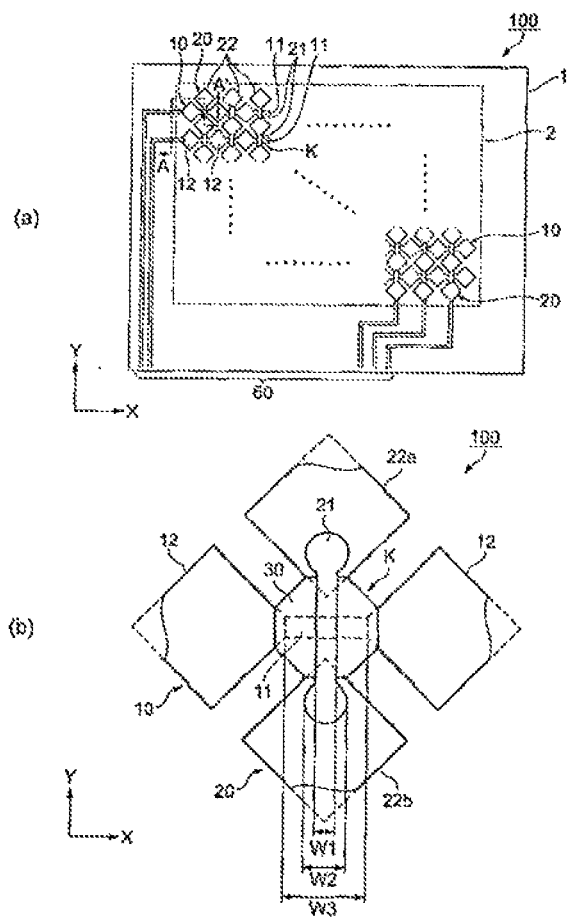
FIG. 27 It shows the configuration of a touch sensor according to the prior art, in which (a) is a plan view showing the whole and (b) is a partially enlarged plan view.

In this case, the manufacturing process for a touch sensor 103 includes only a first transfer step (see FIGS. 22 to 24) and a second transfer step (see FIGS. 25 and 26), a routing wire forming step is not separately required, and thus a step for forming each pattern is further simplified.

Modifications

The present invention is not limited to each embodiment described above. For example, when the substrate 1 is a resin film, the resin film may have an optical function. For example, the resin film may provide a phase difference of $\lambda/4$. Here, providing a phase difference of $\lambda/4$ means that a phase difference of $\lambda/4$ is ideally provided to all the wavelengths in the visible light region. However, if a phase difference at a wavelength of 550 nm is $\lambda/4$, even when phase differences at other wavelengths slightly deviate from $\lambda/4$, it is no problem for practical use. A retardation value ($\Delta nd$) at a wavelength of 550 nm is preferably 125 to 150 nm and more preferably 131 to 145 nm. In this case, the resin film is not limited to a single layer that is the $\lambda/4$ phase difference film. For example, the resin film may be a laminated body in which a $\lambda/4$ phase difference film and an optically isotropic film are adhered to each other. The optically isotropic film is, for example, a film having a retardation ($\Delta nd$) value of 30 nm or less. Furthermore, a laminated body in which a $\lambda/2$ phase difference film and a $\lambda/4$ phase difference film are adhered to each other may be used as the substrate 1.

Each of the first insulating films and the second insulating films may contain a rust preventive. A material that has been already publicly known to be used as a rust preventive is used as the rust preventive, and as a specific example of the rust preventive, imidazole, triazole, benzotriazole, benzimidazole, benzothiazole, pyrazole, or the like may be used. In addition, specific examples of the rust preventive include monocyclic or polycyclic azoles such as halogen-substituted products, alkyl-substituted products, and phenyl-substituted products of these azoles; aromatic amines such as aniline; aliphatic amines such as alkylamines; and salts thereof.

In addition, in the touch sensors 101 to 103 of the respective embodiments described above, since the composite material in which ultra fine conductive carbon fibers or ultrafine conductive fibers made of a silver material are dispersed in a polymer material that serves as a binder is used as the material forming the X electrode films 10 and the Y electrode films 20, the X electrode films 10 and the Y electrode films 20 themselves serve an adhesive function in transfer. However, in the present invention, each of the X electrode films 10 and the Y electrode films 20 may be a laminated film of a film dedicated for conduction and a film dedicated for adhesion. In this case, the electrode-imparting layer 203 of the transfer ribbon 200 which is used for manufacturing a touch sensor has a two-layer structure with a layer dedicated for conduction and a layer dedicated for adhesion. With such a configuration, a material that does not serve an adhesive function in transfer may be used as the material forming the X electrode films 10 and the Y electrode films 20.

Examples of the material of the film dedicated for conduction may include metal oxide materials such as indium tin oxide (ITO), indium oxide, antimony-added tin oxide, fluorine-added tin oxide, aluminum-added zinc oxide, potassium-added zinc oxide, silicon-added zinc oxide, zinc oxide-tin oxide, indium oxide-tin oxide, zinc oxide-indium oxide-magnesium oxide, zinc oxide, and a tin oxide film; and metal materials such as tin, copper, aluminum, nickel and chromium. Two or more of these materials may be combined to form the film dedicated for conduction.

As the material of the film dedicated for adhesion, polyacrylic resin, polystylene resin, polyamide resin, chlorinated polyolefin resin, chlorinated ethylene-vinylacetate copolymer resin, cyclized rubber, cumarone-indene resin, or the like may be used.

It should be noted that as the material of the film dedicated for conduction, the material described for the X electrode films 10 and the Y electrode films 20 in the first to third embodiments may be used. In this case, an adhesive force can be enhanced by the combination of the film dedicated for adhesion and the layer dedicated for adhesion.

When the electrode-imparting layer 203 of the transfer ribbon 200 is configured to have a two-layer structure with a layer dedicated for conduction and a layer dedicated for adhesion, the method for forming the layer dedicated for conduction from the above material is a PVD method such as a sputtering method, a vacuum evaporation method, or an ion plating method, a CVD method, or the like. In addition, examples of the method for forming the layer dedicated for adhesion from the above material include coating methods such as a gravure coating method, a roll coating method, a comma coating method, and a lip coating method, and printing methods such as a gravure printing method and a screen printing method.

In addition, the transfer layers of the transfer ribbon 200 may include a layer other than the insulating layer 202 and the electrode-imparting layer 203. For example, an anchor layer or the like may be provided between the insulating layer 202 and the electrode-imparting layer 203.

In addition, the projection type capacitance touch sensor of the present invention may be of either a self capacitance type or a mutual capacitance type. Moreover, the touch sensors 101 to 103 of the respective embodiments described above are configured to include the X electrode films 10 as the first electrode films and the Y electrode films 20 as the second electrode films, but conversely may be configured to include Y electrode films as first electrode films and X electrode films 20 as second electrode films.

Figure 28:
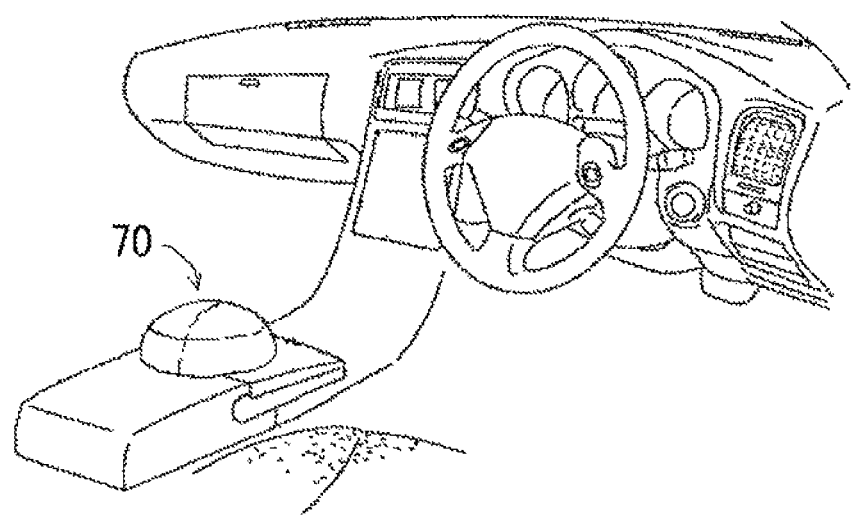
FIG. 28 it is a perspective view showing a driver seat and its neighborhood of an automobile equipped with an input device 70 having a touch sensor of the present invention formed into a hemispherical shape and installed therein.

The touch sensor of the present invention may be formed in a three-dimensional shape. For example, FIG. 28 shows a hemispherical input device 70 installed beside a driver seat such that a hand of a driver easily reaches the input device 70. The hemispherical input device 70 includes the touch sensor of the present invention that is formed in a hemispherical shape, and the driver can perform a navigation operation or the like by tracing the hemispherical portion with his or her hand or moving his or her hand near the hemispherical portion.

It should be noted that the touch sensor formed in a hemispherical shape is used in the input device 70 in FIG. 28, but the shape of the touch sensor of the present invention is not limited to the hemispherical shape, and various three-dimensional shapes such as a cylindrical shape, a curved plate shape, and a dish shape are possible.

In the case where the touch sensor of the present invention is formed in a three-dimensional shape as described above, a substrate that is made of a transparent thermoplastic resin, is softened by heating, and is solidified by cooling is used as the substrate 1 of the touch sensor. Examples of the thermoplastic resin include acrylic resin, fluorine resin, polycarbonate resin, polyester resin, polystylene resin, acrylonitrile-butadiene-styrene resin, polypropylene resin, polyacrylonitrile resin, polyamide resin, urethane resin, and vinylester resin. In addition, a base sheet may be a coextruded composite material, and, for example, a film with a two-type three-layer structure of PMMA/PC/PMMA, or the like may be used.

EXPLANATIONS OF LETTERS OR NUMERALS

1 Substrate
2 Input region
10 X electrode film
11 First bridge wiring portion
12 First island-like electrode portion
13 First connection portion
20 Y electrode film
21 Second bridge wiring portion
22 Second island-like electrode portion
23 Second connection portion
30, 40, 50 Insulating films
70 Input device
60, 81, 62 Routing wires
100, 101, 102, 103 Touch sensors
200 Transfer ribbon
201 Release film
202 Insulating layer
203 Electrode-imparting layer

The invention claimed is:

1. A touch sensor comprising a plurality of first electrode films and a plurality of second electrode films which are formed on a surface of a substrate and are arranged in different directions from each other, wherein
    each first electrode film integrally includes:
        a plurality of first island-like electrode portions formed so as to be spaced apart from each other in a first direction on the substrate; and
        first bridge wiring portions each formed so as to be electrically connected between the adjacent first island-like electrode portions,
    a first insulating film is further formed on each first electrode film so as to cover, in the same shape, the first island-like electrode portions and the first bridge wiring portions,
    each second electrode film integrally includes:
        a plurality of second island-like electrode portions formed so as to be spaced apart from each other in a second direction different from the first direction on the substrate without overlapping with the first insulating film; and
        second bridge wiring portions each formed via a portion of the first insulating film that covers the first bridge wiring portion, so as to be electrically connected between the adjacent second island-like electrode portions,
    a second insulating film is further formed on each second electrode film so as to cover, in the same shape, the second island-like electrode portions and the second bridge wiring portions,
    the first electrode film and the first insulating film are formed as a first transfer layer, and
    the second electrode film and the second insulating film are formed as a second transfer layer.

2. The touch sensor according to claim 1, wherein the substrate is composed of a resin film.

3. The touch sensor according to claim 1, further comprising routing wires integrally extending from the first electrode films and the second electrode films, wherein
    the first insulating film and the second insulating film are also formed on each routing wire so as to cover an entirety thereof except for a terminal portion thereof.

4. The touch sensor according to claim 1, further comprising routing wires electrically connected to one ends of the first electrode films and the second electrode films from a side opposite to the substrate.

5. The touch sensor according to claim 1, further comprising routing wires electrically connected to one ends of the first electrode films and the second electrode films from a substrate side.

6. The touch sensor according to claim 1, wherein each of the first insulating films and the second insulating films contains a rust preventive.

7. A manufacturing method for the touch sensor according to claim 1, the manufacturing method comprising:
- a first transfer step of using a transfer ribbon formed by sequentially laminating at least an insulating layer and an electrode-imparting layer as transfer layers on an entirety of a surface of a long release film, superimposing the transfer ribbon on the substrate such that the release film is located at an outer side, partially applying thermal pressure thereto from the release film side, thereby adhering only portions of the transfer layers to which the thermal pressure is applied, to the substrate, and separating the release film therefrom, thereby transferring the transfer layers into at least shapes of the first electrode films; and
- a second transfer step of, after the first transfer step, using a transfer ribbon having the same configuration as that in the first transfer step, superimposing the transfer ribbon on the substrate and the layers transferred in the first transfer step such that the release film is located at an outer side, partially applying thermal pressure thereto from the release film side, thereby adhering only portions of the transfer layers to which the thermal pressure is applied onto the substrate and the layers transferred in the first transfer step, and separating the release film therefrom, thereby transferring the transfer layers into at least shapes of the second electrode films.

8. The manufacturing method for the touch sensor according to claim 7, wherein
- in the first transfer step, the transfer layers are transferred into a shape including not only the first electrode film but also the routing wires extending from the first electrode films; and
- in the second transfer step, the transfer layers are transferred into a shape including not only the second electrode films but also the routing wires extending from the second electrode films.

9. The manufacturing method for the touch sensor according to claim 7, further comprising a routing wire forming step of, after the second transfer step, forming the routing wires electrically connected to the one ends of the first electrode films and the second electrode films.

10. The manufacturing method for the touch sensor according to claim 7, further comprising a routing wire forming step of, before the first transfer step, previously forming the routing wires such that the routing wires are electrically connected to the one ends of the first electrode films and the second electrode films.

11. A transfer ribbon for use in the manufacturing method for the touch sensor according to claim 7, wherein
the transfer ribbon is formed by sequentially laminating at least an insulating layer and an electrode-imparting layer as transfer layers on an entirety of a surface of a long release film.

12. The touch sensor according to claim 1, further comprising a polarizer at a front surface of the touch sensor.

* * * * *